United States Patent
Layton et al.

(10) Patent No.: US 10,629,182 B1
(45) Date of Patent: Apr. 21, 2020

(54) ADAPTIVE NOISE MASKING METHOD AND SYSTEM

(71) Applicants: BlackBerry Limited, Waterloo (CA); 2236008 Ontario Inc., Waterloo (CA)

(72) Inventors: Leonard Charles Layton, Vancouver (CA); Mark Robert Every, Surrey (CA)

(73) Assignees: BlackBerry Limited, Waterloo, Ontario (CA); 2236008 Ontario Inc., Waterloo, Ontario (CA)

( * ) Notice: Subject to any disclaimer, the term of this patent is extended or adjusted under 35 U.S.C. 154(b) by 0 days.

(21) Appl. No.: 16/449,901

(22) Filed: Jun. 24, 2019

(51) Int. Cl.
| | |
|---|---|
| *H04R 3/02* | (2006.01) |
| *G10K 11/175* | (2006.01) |
| *H04R 29/00* | (2006.01) |
| *H04R 3/04* | (2006.01) |
| *H03G 3/30* | (2006.01) |

(52) U.S. Cl.
CPC ............ *G10K 11/175* (2013.01); *H04R 3/04* (2013.01); *H04R 29/001* (2013.01); *H03G 3/3005* (2013.01); *H03G 2201/103* (2013.01); *H04R 2499/13* (2013.01)

(58) Field of Classification Search
CPC ....................................................... H04R 3/02
See application file for complete search history.

(56) References Cited

U.S. PATENT DOCUMENTS

| | | | | |
|---|---|---|---|---|
| 5,204,971 | A * | 4/1993 | Takahashi | H03G 3/32 381/86 |
| 5,384,853 | A | 1/1995 | Kinoshita et al. | |
| 5,434,926 | A * | 7/1995 | Watanabe | H03G 3/32 381/108 |
| 9,583,091 | B2 | 2/2017 | Lennstrom | |
| 9,893,697 | B1 * | 2/2018 | Churchwell, II | H03G 3/32 |
| 10,065,561 | B1 * | 9/2018 | Bastyr | B60W 40/105 |
| 2005/0135635 | A1 * | 6/2005 | Prince | H03G 9/005 381/86 |
| 2011/0010015 | A1 * | 1/2011 | Jordan | B60H 1/00735 700/280 |
| 2011/0235693 | A1 * | 9/2011 | Lee | H04S 7/00 375/224 |

(Continued)

*Primary Examiner* — Olisa Anwah
(74) *Attorney, Agent, or Firm* — Rowand LLP (57) ABSTRACT

A method and system for adaptive noise masking powertrain noise in a vehicle is described. The method comprises: determining frequency and amplitude characteristics of the powertrain noise; determining amplitude characteristics of background noise in the vehicle; dynamically generating a masking audio signal based on the determined characteristics of the powertrain noise and background noise; and outputting the masking audio signal in a cabin of the vehicle. The system includes: a processor; a memory storing processor-executable instructions that, when executed, cause the processor to determine frequency and amplitude characteristics of the powertrain noise and to determine amplitude characteristics of background noise in the vehicle; a masking noise generator for dynamically generating a masking audio signal based on the determined characteristics of the powertrain noise and background noise; and one or more vehicle cabin loudspeakers for receiving and outputting the masking audio signal in a cabin of the vehicle.

30 Claims, 7 Drawing Sheets

(56) References Cited

U.S. PATENT DOCUMENTS

| | | | |
|---|---|---|---|
| 2012/0076314 A1* | 3/2012 | Reilly | G10K 15/02 381/71.4 |
| 2015/0030175 A1* | 1/2015 | Roggenkamp | G10K 11/002 381/73.1 |
| 2015/0043744 A1* | 2/2015 | Lagodzinski | H04R 3/002 381/73.1 |
| 2015/0334490 A1* | 11/2015 | Pan | G10K 11/178 381/71.4 |
| 2019/0066649 A1* | 2/2019 | Valeri | G10K 11/17873 |
| 2019/0311705 A1* | 10/2019 | Trumpy | G10K 15/02 |

* cited by examiner

ADAPTIVE NOISE MASKING METHOD AND SYSTEM

FIELD

The present application generally relates to noise masking, and more particularly, to perceptual masking of vehicle noise.

BACKGROUND

As the world's population continues to grow, its transportation demands are likewise rapidly increasing. Automobile usage is on the rise worldwide with some estimates reporting over 1 billion vehicles on the world's roads today and 2 billion by the year 2035. These estimates include passenger cars, light-, medium-, and heavy-duty trucks, and buses.

In many parts of the world, electric vehicles (EV) and hybrid-electric vehicles (HEV) have become feasible alternatives to traditional internal combustion engine (ICE) vehicles. This is especially true is some developing countries and in some emerging markets where large segments of population are rising in socio-economic level, and many more people are thus able to afford EV and HEV vehicles for both personal and commercial use.

EV/HEV powertrains, while quieter than internal combustion engines, can still produce unwanted noises which may cause annoyance to the occupants of a vehicle. EVs, in particular, tend to emit disturbing sounds such as high-pitched tones or "whine". These sounds can be very tonal in nature and are typically in a frequency range of 500 Hz to 4 kHz. The perceptibility and annoyance of these tones is dependent on their frequency and amplitude relative to other noise within the vehicle. Unfortunately, this frequency range is outside the range that can be effectively mitigated using active noise control. Passive noise and vibration dampening methods can be effective, but in most cases do not eliminate the whine entirely from the cabin. Therefore, there is a need for an improved way of masking undesirable vehicle powertrain tones.

BRIEF DESCRIPTION OF THE DRAWINGS

Reference will now be made, by way of example, to the accompanying drawings which show example embodiments of the present application, and in which.

Similar reference numerals may have been used in different figures to denote similar components.

DESCRIPTION OF EXAMPLE EMBODIMENTS

In a first aspect, the present application describes a method of masking powertrain noise in a vehicle comprising: determining frequency and amplitude characteristics of the powertrain noise, determining amplitude characteristics of background noise in the vehicle, dynamically generating a masking audio signal based on the determined characteristics of the powertrain noise and background noise, and outputting the masking audio signal in a cabin of the vehicle.

In some implementations, the powertrain noise emanates from one or more of the vehicle engine, electric motor, transmission, drive shafts, differentials, and battery.

In other implementations, the powertrain noise is tonal in nature and in a frequency range of 500 Hz to 4000 Hz.

In one aspect, determining the frequency and amplitude characteristics of the powertrain noise or the amplitude characteristics of background noise includes deriving the characteristics from a model for the vehicle.

In some implementations, determining the frequency and amplitude characteristics of the powertrain noise or the amplitude characteristics of background noise includes measuring the characteristics in the cabin of the vehicle.

In other implementations, determining the frequency and amplitude characteristics of the powertrain noise includes adjusting the characteristics based on one or more of: engine RPM, motor RPM, engine load, motor load, vehicle speed, and vehicle acceleration.

In a further aspect, the background noise in the vehicle includes sound resulting from at least one of wind, road, or tires.

In some implementations, outputting the masking audio signal includes playing the masking audio signal through one or more loudspeakers of a vehicle audio system.

In yet a further aspect, the method of masking powertrain noise in a vehicle comprises adaptively filtering one or more of: HVAC sound, occupant conversation sound, vehicle audio system sound, and the determined characteristics of the powertrain noise from the determined characteristics of background noise in the vehicle.

In some implementations, the generated masking audio signal emulates vehicle background noise at a higher vehicle speed than a current vehicle speed.

In a second aspect, the present application describes an adaptive noise masking system for masking powertrain noise in a vehicle. The system may include a noise estimator to determine frequency and amplitude characteristics of the powertrain noise and to determine amplitude characteristics of background noise in the vehicle; a masking noise generator to dynamically generate a masking audio signal based on the determined characteristics of the powertrain noise and background noise; and one or more vehicle cabin loudspeakers to receive and output the masking audio signal in a cabin of the vehicle.

In a further aspect, the adaptive noise masking system comprises one or more cabin microphones for measuring at least one of the powertrain noise and the background noise in the cabin of the vehicle.

In yet a further aspect, the adaptive noise masking system comprises an adaptive notch filter for filtering one or more of: HVAC sound, occupant conversation sound, vehicle audio system sound, and the determined characteristics of the powertrain noise from the determined characteristics of background noise in the vehicle.

In some implementations, the adaptive noise masking system memory stores at least one of a cabin noise estimator and a whine noise model, the cabin noise estimator provides a model of background noise characteristics to the processor, and the whine noise model provides a model of powertrain noise characteristics to the processor.

In another implementation, the adaptive noise masking system memory stores a masking model, the masking noise generator dynamically generating a masking audio signal is based on instructions included in the masking model.

In another aspect, the adaptive noise masking system comprises an amplifier for boosting the masking audio signal gain between the masking noise generator and the one or more vehicle cabin loudspeakers.

Other aspects and features of the present application will be understood by those of ordinary skill in the art from a review of the following description of examples in conjunction with the accompanying figures.

In the present application, the terms "about", "approximately", and "substantially" are meant to cover variations that may exist in the upper and lower limits of the ranges of values, such as variations in properties, parameters, and dimensions. In a non-limiting example, the terms "about", "approximately", and "substantially" may mean plus or minus 10 percent or less.

In the present application, the term "and/or" is intended to cover all possible combinations and sub-combinations of the listed elements, including any one of the listed elements alone, any sub-combination, or all of the elements, and without necessarily excluding additional elements.

In the present application, the phrase "at least one of . . . or . . . " is intended to cover any one or more of the listed elements, including any one of the listed elements alone, any sub-combination, or all of the elements, without necessarily excluding any additional elements, and without necessarily requiring all of the elements.

The drivetrain of a motor vehicle is the group of components that deliver power to the driving wheels. This excludes the engine or motor that generates the power. In contrast, the powertrain is considered to include both the engine or motor and the drivetrain. Noise may emanate from such powertrain components as: the vehicle engine, electric motor, transmission, drive shafts, differentials, and battery. In particular, EV whine noise originates in the electric motor and transmission of the vehicle. This noise varies in amplitude and spectrum depending on the speed, acceleration/deceleration, and load, but generally consists of tonal (narrowband) components at specific frequencies related to the rotational frequency of the electric motor(s) and multiples of those frequencies (harmonics/orders).

As noted above, vehicle powertrains may emit mid-to-high frequency tonal noise regardless of whether attached to an internal combustion engine, hybrid gasoline-electric engine, or pure electric motor. This tonal noise may be disturbing to vehicle occupants, yet it cannot be minimized through active noise cancellation techniques. The reason for this is that tonal powertrain noises appear in a frequency range of 500 Hz to 4000 Hz which is outside the effective range of conventional active noise control techniques. Passive noise and vibration dampening methods can be effective, but in most cases do not eliminate the whine entirely from the cabin.

Accordingly, in accordance with one aspect of the present application, a method of masking powertrain noise in a vehicle is described. The method, in one example implementation, adapts a masking audio signal in loudness (amplitude) and spectrum (frequency) depending on (a) frequency and amplitude characteristics of the powertrain noise, and (b) amplitude of vehicle background noise. The masking audio signal is then output in a cabin of the vehicle.

In this way, the masking audio signal emulates a higher "natural" noise condition to make the disturbing powertrain noise inaudible.

When a vehicle is driving, there are various components of noise and sound heard by the occupants, such as: powertrain noise (described above), road noise, wind noise, HVAC noise, conversations sounds, and vehicle audio system sound.

Road noise originates in the interaction between the wheels, tires and suspension and how those mechanical components interact with the cabin & chassis of the vehicle. This type of noise is broadband in nature with a generally 1/f spectral profile—with higher amplitudes in the lower frequency ranges. This noise increases in amplitude with speed and varies with road surface conditions.

Wind noise originates in the way air flows around the vehicle and in and out of open windows, sunroofs, etc. This noise is broadband in nature and increases in overall amplitude with (air) speed.

HVAC noise originates inside the cabin via the heating, ventilation and air-conditioning (HVAC) system of the vehicle. This noise is generally broadband in nature ("white noise") and varies by system settings such as defrost mode, fan speed, vents open/closed and directions of vents.

While powertrain noise, as well as conversation and audio system sounds, are generally tonal in nature with lots of potential variance, background noise consisting of road and wind noise is broadband in nature and exhibits approximately a 1/f spectral profile ("pink noise") with overall higher amplitudes in lower frequency range. The nature of pink noise as "natural sound" is such that the human brain tends to tune it out.

The masking audio signal generated according to the present application reduces the apparent audibility of the mid-to-high frequency tonal powertrain noise using perceptual masking by background broadband noise. Perceptual masking or psychoacoustic masking is a phenomenon in which a higher amplitude sound signal can prevent another lower amplitude signal from being perceived. The present invention leverages this psychoacoustic phenomenon by synthesizing a sound signal (masking audio signal/added masking noise) that reduces the perceptibility of powertrain whine sound to a point that it is either inaudible or no longer annoying. The masking audio signal/added masking noise has the effect of raising the hearing threshold of the listener above that of the powertrain whine, thereby rendering it inaudible.

Figure 1:
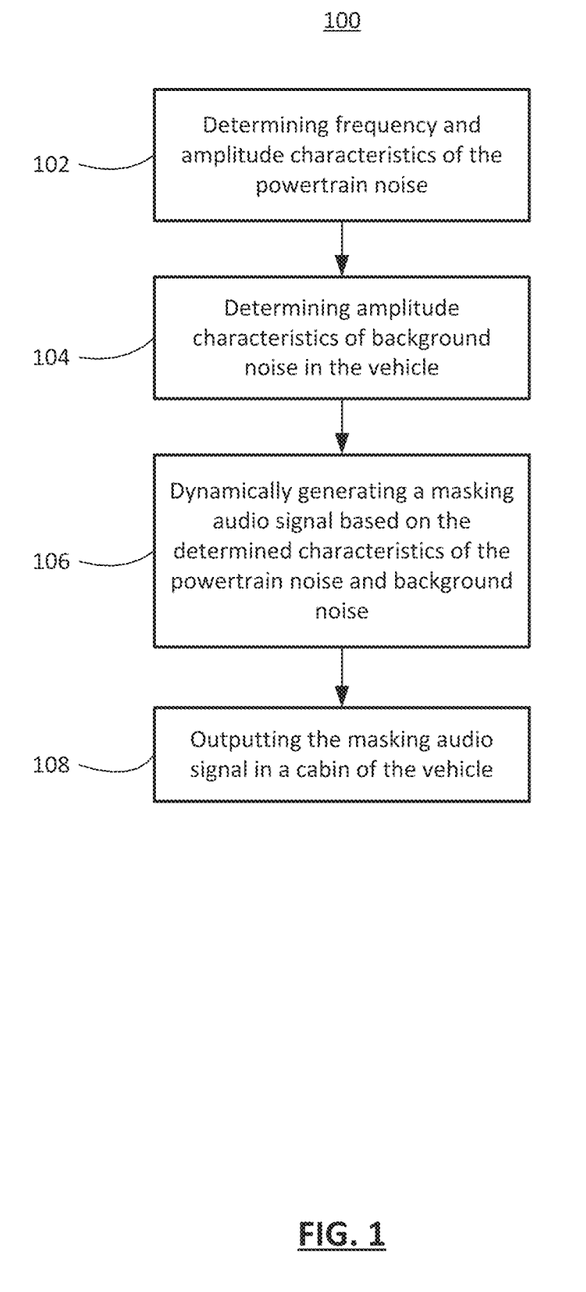
FIG. 1 shows, in flowchart form, an example method of masking powertrain noise in a vehicle.

Reference is first made to FIG. 1, which shows an example method 100 of masking powertrain noise in a vehicle. The method 100 may, for example, be carried out by a noise masking application or module within a vehicle infotainment system.

At operation 102, frequency and amplitude characteristics of the powertrain noise are determined. In one example embodiment, the characteristics of the powertrain noise may be determined by deriving the characteristics from a specific model for the vehicle. In other words, the characteristics may be hard-coded in a software model detailing powertrain noise characteristics for that particular vehicle. It may also be that the software model is updateable over-the-air (OTA) from the vehicle manufacturer or any other provider and/or that the software model is adjustable based on a feedback loop. In another example embodiment, the characteristics of the powertrain noise may be determined by adjusting the characteristics based on one or more vehicle parameters. Example parameters include: engine RPM, motor RPM, engine load, motor load, vehicle speed, and vehicle acceleration. It is noted that such vehicle parameters may also supply the specific model for the vehicle, thereby allowing adjustment of the model. In a further example embodiment, the characteristics of the powertrain noise may be determined by measuring the characteristics in the cabin of the vehicle using one or more microphones. Further details regarding these example embodiments are discussed below in relation to FIG. 2.

At operation 104, amplitude characteristics of background noise in the vehicle are determined. As with the powertrain noise, background noise may be either derived from a specific model for the vehicle (i.e. predetermined) or may be measured in the cabin of the vehicle, such as, for example, by one or more microphones. Further, also just as with the powertrain noise, the vehicle-specific background noise model may also be updateable through various means, such as OTA or via a feedback loop.

At operation 106, a masking audio signal based on the determined characteristics of the powertrain noise and background noise is dynamically generated. As described further in relation to FIG. 2 and FIG. 6, the masking audio signal is synthesized to match the spectrum of background noise in the vehicle. The masking audio signal may have approximately the same spectrum as the noise spectrum of the cabin—neglecting the contribution of the powertrain whine noise spectrum—as the vehicle is driven at different speeds. Put another way, it is desirable to synthesize a "natural" sounding masking audio signal that emulates the noise spectrum of the vehicle as if it were being driven at a higher speed so as to mask the perception of the powertrain whine noise at the current speed.

At operation 108, the masking audio signal is output in a cabin of the vehicle. In one example embodiment, the masking audio signal is output by playing it through one or more loudspeakers of the vehicle audio system. As described above, the masking audio signal closely matches the spectrum of background noise in the vehicle. Thus, the occupants will tend not to perceive the tonal powertrain noise, but instead will simply hear louder overall background noise.

Figure 2:
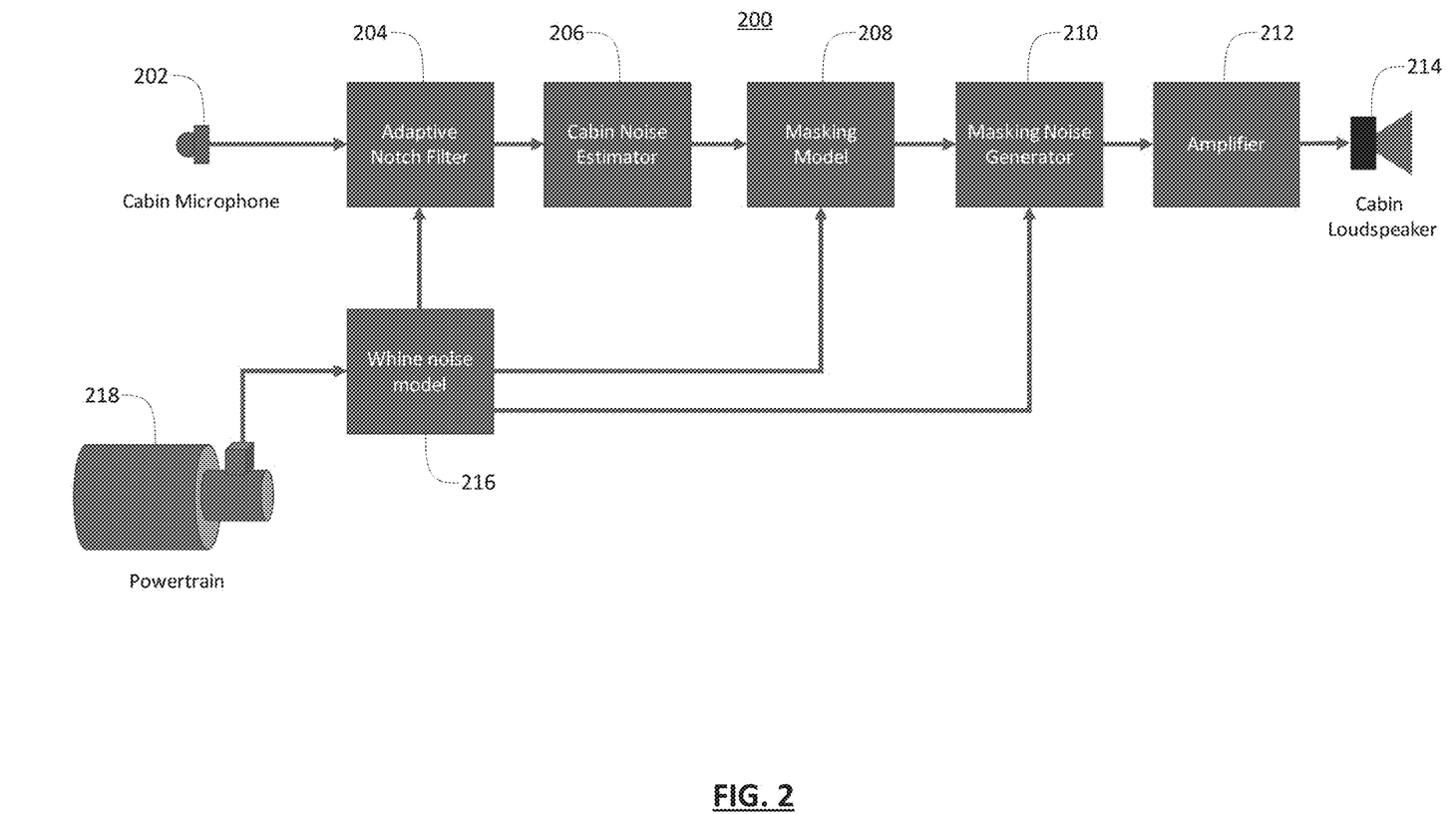
FIG. 2 depicts, in block diagram form, an example adaptive noise masking system for masking powertrain noise in a vehicle.

Reference is now made to FIG. 2, which depicts an example adaptive noise masking system 200 for masking powertrain noise in a vehicle. It may be that Adaptive Notch Filter 204, Cabin Noise Estimator 206, Whine noise model 216, Masking Model 208, and Masking Noise Generator 210 are all implemented in software executable by a processor.

In one example, Cabin Microphone 202 (which may include one or more microphones) measures at least one of the powertrain noise and the background noise in a cabin of the vehicle. The measured noise is sent to Adaptive Notch Filter 204 for filtering, as described below, and, ultimately to Masking Noise Generator 210 for dynamically generating a masking audio signal based on determined characteristics of the powertrain noise and background noise. In another example, the actual recordings from Cabin Microphone 202 are used for training of one or both of a background noise model (Cabin Noise Estimator 206) and a powertrain noise model (Whine noise model 216). Put differently, the Cabin Microphone 202 recordings from a specific vehicle may be used for analysis, training of noise models, and re-synthesizing of a masking audio signal. In the case of measuring powertrain noise or training a powertrain noise model, Cabin Microphone 202 may include one or more dedicated microphones located near the vehicle powertrain components.

The Adaptive Notch Filter 204 may, in a particular embodiment, be for filtering certain sounds from the determined characteristics of measured background noise as picked up by Cabin Microphone 202. These certain sounds may include one or more of: HVAC sound, occupant conversation sound, vehicle audio system sound, and the determined characteristics of the powertrain noise. Some of these certain sounds, or components of these certain sounds, may be considered as background sounds. The reason for filtering certain sounds considered as background sounds is because these sounds are already contributing to masking of the powertrain noise in the vehicle. Thus, HVAC noise and any other "white" noise may be subtracted from the determined background noise so as to not produce unnecessarily loud masking noise (i.e. white noise is already partially masking the undesired whine noise by raising the noise floor). Likewise, vehicle audio system sound (e.g. music) aids in masking powertrain noise and can thus be filtered to not contribute towards the masking audio signal. In one example, the adaptive noise masking system 200 is coupled to the vehicle audio system thereby allowing the Adaptive Notch Filter 204 to accurately take into account any audio being played by the vehicle audio system. The reason for filtering the determined characteristics of the powertrain noise by the Adaptive Notch Filter 204 is to "notch out" the powertrain whine tones such that they do not form part of the final masking audio signal. Without filtering of the whine tones, the result may be unnecessary amplitude peaks of the masking audio signal around the powertrain noise tone frequencies.

In a particular embodiment, a Cabin Noise Estimator 206 provides a model of background noise characteristics to a processor and a Whine noise model 216 provides a model of powertrain noise characteristics to the processor. Both models may provide the Masking Model 208 with noise characteristics for further processing by the processor. In the case of Cabin Noise Estimator 206, it is either pre-programmed with background noise characteristics for the specific vehicle, or it is trained by actual recordings from Cabin Microphone 202. In a particular example, Cabin Noise Estimator 206 may be continuously updated/adjusted through a feedback mechanism of the system. As Cabin Noise Estimator 206 provides background noise characteristics to Masking Model 208 and subsequently to Masking Noise Generator 210 for synthesizing of the masking audio signal, the system processor evaluates if the powertrain noise masking can be improved, and if so, the Cabin Noise Estimator 206 obtains current sound data from the Cabin Microphone 202 in order that the background noise model may be adjusted accordingly. Similarly, for Whine noise model 216, it is either pre-programmed with powertrain noise characteristics for the specific vehicle, or it is trained by actual recordings from Cabin Microphone 202. In one example, Whine noise model 216 may be continuously updated/adjusted through a feedback mechanism of the system. As Whine noise model 216 provides powertrain noise characteristics to Masking Model 208 and subsequently to Masking Noise Generator 210 for synthesizing of the masking audio signal, the system processor evaluates if the powertrain noise masking can be improved, and if so, the Whine noise model 216 obtains current sound data from the Cabin Microphone 202 in order that the powertrain noise model may be adjusted accordingly. The Cabin Noise Estimator 206, the Whine noise model 216 and/or processor may be collectively referred to herein as a noise estimator.

In a further example embodiment, the characteristics of the powertrain noise in Whine noise model 216 may be determined by adjusting the characteristics based on one or more vehicle parameters. Example parameters include: engine RPM, motor RPM, engine load, motor load, vehicle speed, and vehicle acceleration. In this particular example, the vehicle parameters supply Whine noise model 216, however, as discussed above, the vehicle parameters (e.g. motor RPM) may be used to adjust the characteristics of the determined powertrain noise directly (i.e. without making use of a model).

As shown in FIG. 2, the Masking Model 208 receives as input, in one example, the measured and filtered powertrain noise as well as the measured background noise from Cabin microphone 202. In another example, the Masking Model 208 receives modeled powertrain noise characteristics from Whine noise model 216 as well as modeled or measured background noise characteristics from Cabin Noise Estimator 206. The Masking Model 208 may include instructions for executing certain processes, such as smoothing of the determined background noise profile by, for example, filling in gaps in the spectrum left by the Adaptive Notch Filter 204 (see FIG. 5).

Next, the Masking Model 208 sends its output to the Masking Noise Generator 210, which, for its part, dynamically generates a masking audio signal based on the determined characteristics of the powertrain noise and background noise. Additionally or alternatively, Masking Noise Generator 210 may also receive input directly from Cabin Microphone 202 via Adaptive Notch Filter 204. The powertrain noise characteristics may be determined in a number of ways. Specifically, the frequencies and amplitudes of the powertrain noise tones may be determined and/or adjusted based on one or more vehicle parameters, as described above. In a particular example, EV engine orders may be stationary (e.g. during cruising) or vary in frequency and amplitude (e.g. during acceleration/braking). The RPM of EV powertrain 218 components may be provided to the system 200 with low latency, such as over a high-speed CAN bus. Therefore, the n-th EV engine order occurs at frequency $f_n=n*RPM/60$. In this way, the frequencies of all engine orders may be determined. However, determining the engine order amplitudes may be less predictable. The amplitudes may be determined, for example, by analyzing the spectra of one or more Cabin Microphone 202 signals in the cabin. A frame-based method may also be used, such as STFT, or a continuous filter bank method. The magnitude spectrum of the microphone (computed using FFT, DFT or other method) is denoted $X[k]$ where k is the frequency bin.

The background noise characteristics may be determined by forming an estimate of the background noise within the vehicle ($N[k]$) using various methods for spectral envelope estimation such as: filtering of spectral coefficients, applying 1st order smoothing across the frequency spectrum, linear predictive coding (LPC) method, or polynomial fitting. In some cases, and as previously discussed, it may be beneficial to notch out the engine orders prior to computing the envelope, for example by setting $X[k] \rightarrow 0$ when $|F(k)-f_n|<$delta, where $F[k]$ is the frequency of bin k and delta is a threshold.

Comparing $X[k]$ to $N[k]$ at each bin k closest to the engine order frequency (i.e. where $|F(k)-f_n|<$delta), the amplitude of the n-th engine order may be estimated as $\max(0, X[k] \rightarrow alpha*N[k])$ where alpha is an over-subtraction factor. Other methods may also be used to determine the amplitude ($a_n$), such as, for example, sinusoidal spectrum estimators which determine how "peaky" the spectral amplitude envelope is. Finally, a masking audio signal spectral envelope $M[k]$ is constructed based on the amplitudes ($a_n$) and frequencies ($f_n$) of the engine orders, both determined according to above. In bins where the masking audio signal would be lower than the existing noise in the vehicle (i.e. $M[k]<N[k]$), we may set $M[k] \rightarrow 0$. The masking audio signal is then created by filtering white noise through a filter shaped according to $M[k]$.

Amplifier 212 receives the generated masking audio signal from Masking Noise Generator 210, boosts the signal gain by an appropriate amount as determined by the system/processor, and passes the signal to Cabin Loudspeaker 214.

Cabin Loudspeaker 214, which may include one or more speakers inside the vehicle cabin, receives the amplified masking audio signal and outputs the signal in the vehicle cabin. This output signal masks undesired powertrain noise.

As described above, Powertrain 218 may provide certain vehicle parameters to one or both of Whine noise model 216 or Masking Model 208. The vehicle parameters (e.g. speed & acceleration) may be useful in helping produce an effective masking audio signal. For example, a target EV whine noise is audible only at lower speeds and typically more so during high acceleration. As the vehicle accelerates from zero, broadband background noise may be subtly introduced, such as, for example, simulated HVAC noise plus some road and wind noise (that would normally be heard at higher speeds). This type of noise is rapidly "tuned out" by the human brain as it adapts to the background noise conditions. As the speed increases, the "natural" background noise increases and so the added masking audio signal can be reduced. If the vehicle suddenly accelerates and the EV whine becomes prominent then the masking audio signal is increased until such time that the EV whine dies down or the "natural" background noise is loud enough to mask by itself.

Reference is now made to FIGS. 3-6 which illustrate example frequency spectrums.

Figure 3:
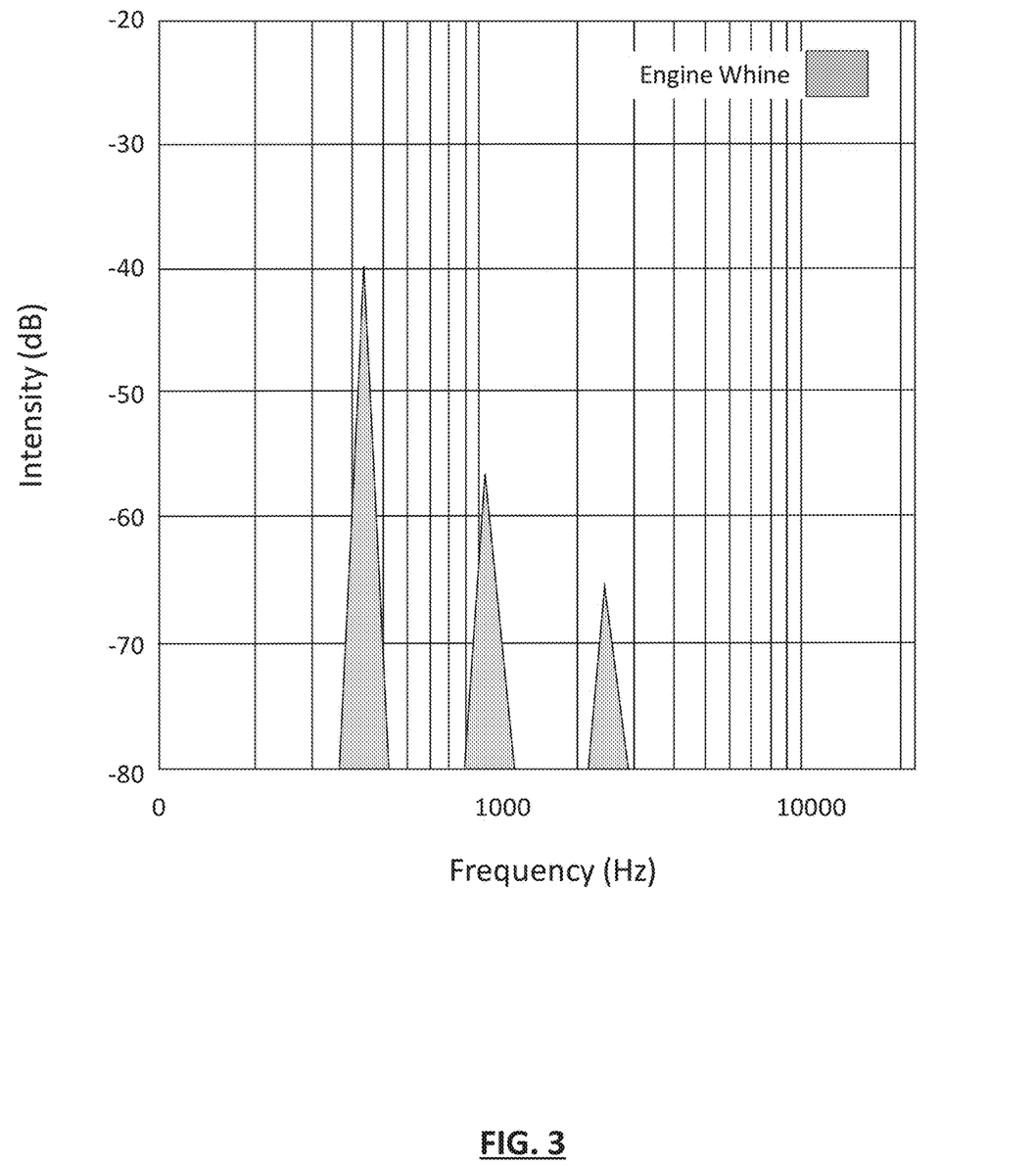
FIG. 3 illustrates, in graph form, an example frequency spectrum of engine whine.

In FIG. 3, powertrain noise or "Engine Whine" is depicted as three distinct narrowband tones centered around 1000 Hz. The loudest tone is about −40 dB.

Figure 4:
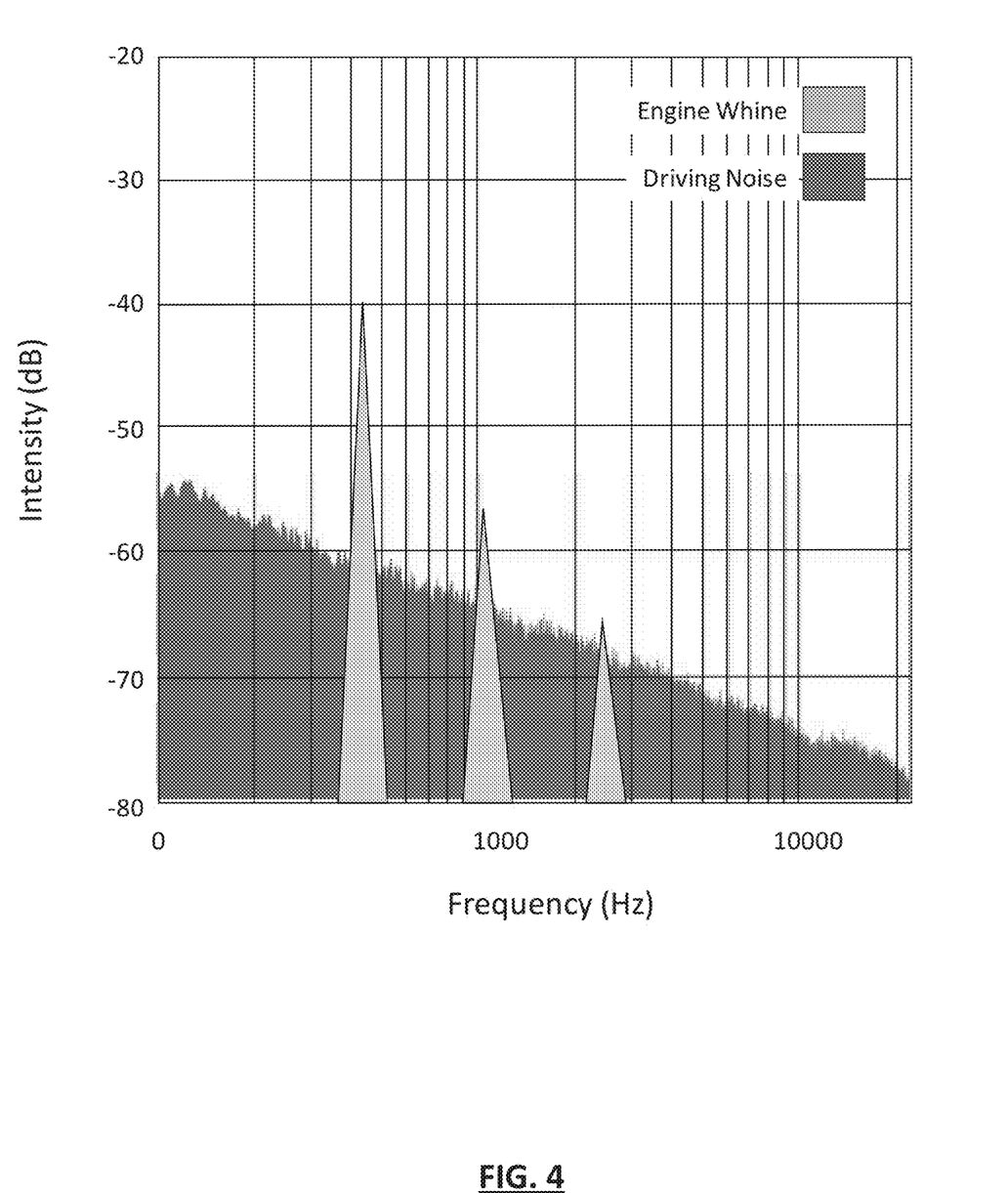
FIG. 4 illustrates, in graph form, the example frequency spectrum of FIG. 3 with driving noise depicted.

In FIG. 4, background noise or "Driving Noise" is depicted as pink noise. The maximum amplitude of the driving noise is about −55 dB and follows a 1/f spectral profile.

Figure 5:
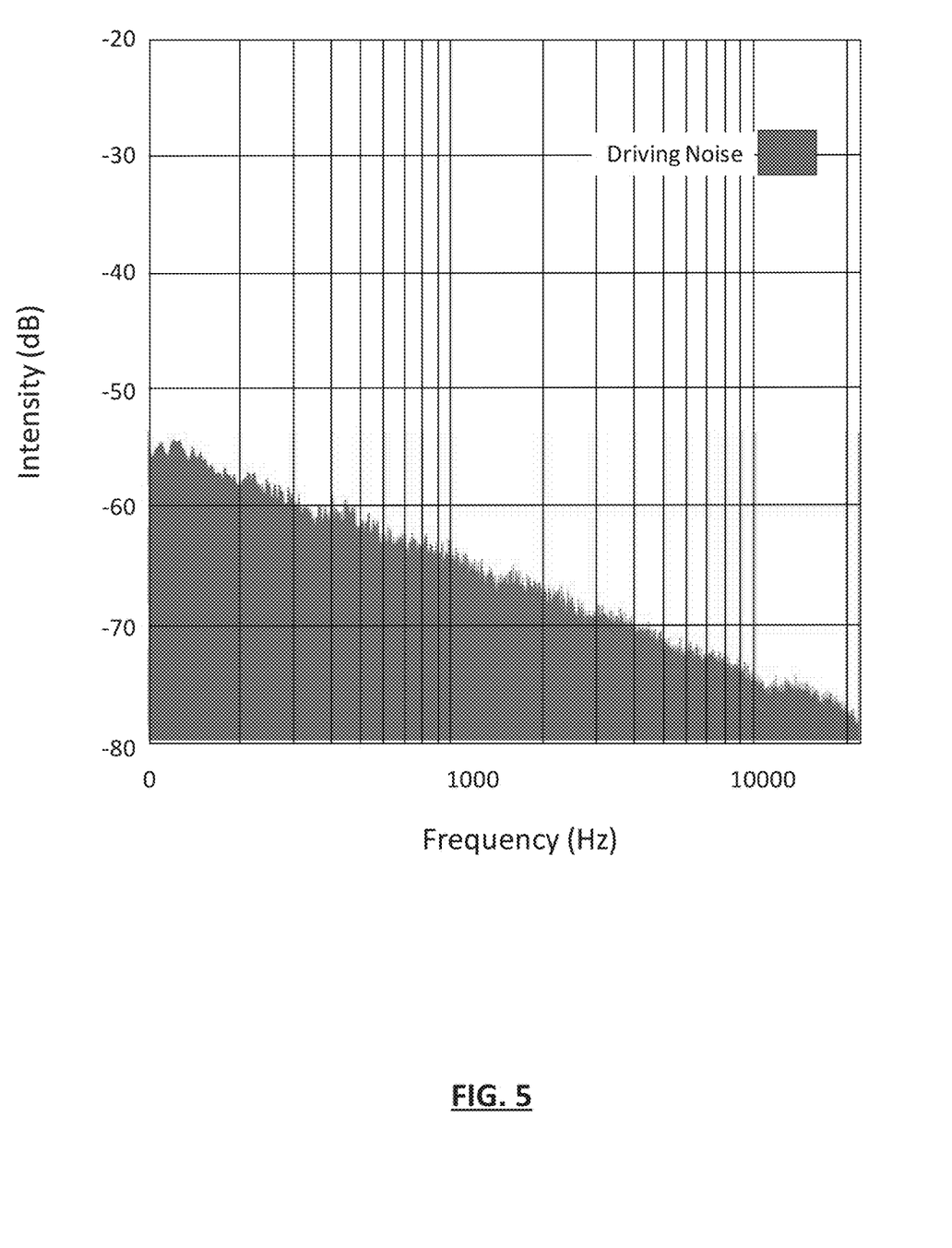
FIG. 5 illustrates, in graph form, the example frequency spectrum of FIG. 4 with the engine whine adaptively filtered.

In FIG. 5, the engine whine has been adaptively filtered or "notched" out, leaving only the driving noise remaining. As shown, the driving noise profile has also been smoothed, or, in other words, gaps in the spectrum left by filtering the engine whine have been filled in through interpolation or any other known technique.

Figure 6:
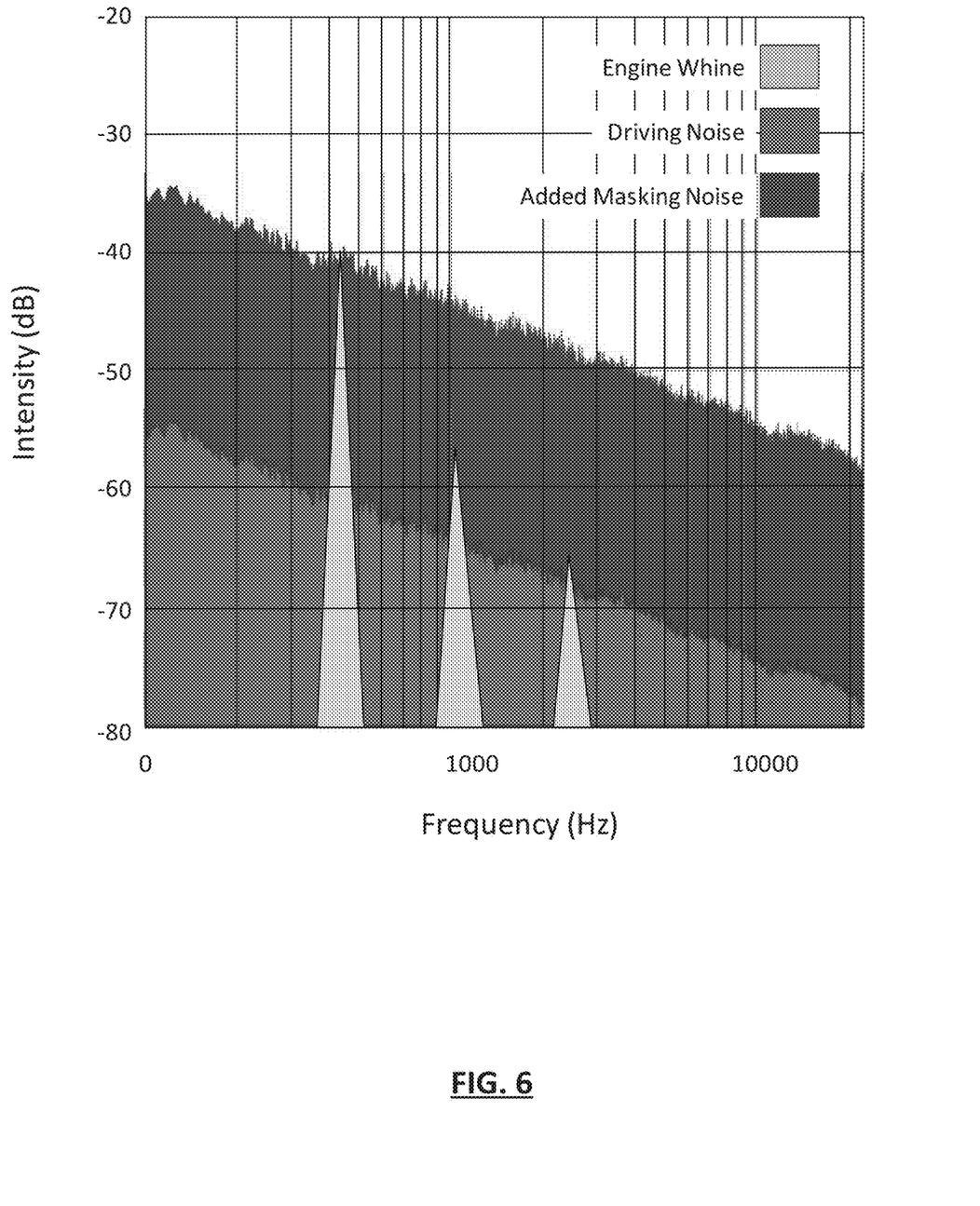
FIG. 6 illustrates, in graph form, the example frequency spectrum of FIG. 4 with added masking noise depicted.

In FIG. 6, the engine whine tones and driving noise are again depicted as well as the masking audio signal or "Added Masking Noise". The added masking noise has been synthesized based on both the engine whine and driving noise. Specifically, it is determined that the loudest tone of engine whine is about −40 dB at a particular frequency, and that the driving noise is about −60 dB at that same frequency. Therefore, the added masking noise seeks to add 20 dB to the driving noise amplitude in order to emulate the driving noise and still effectively mask the loudest tone.

Figure 7:
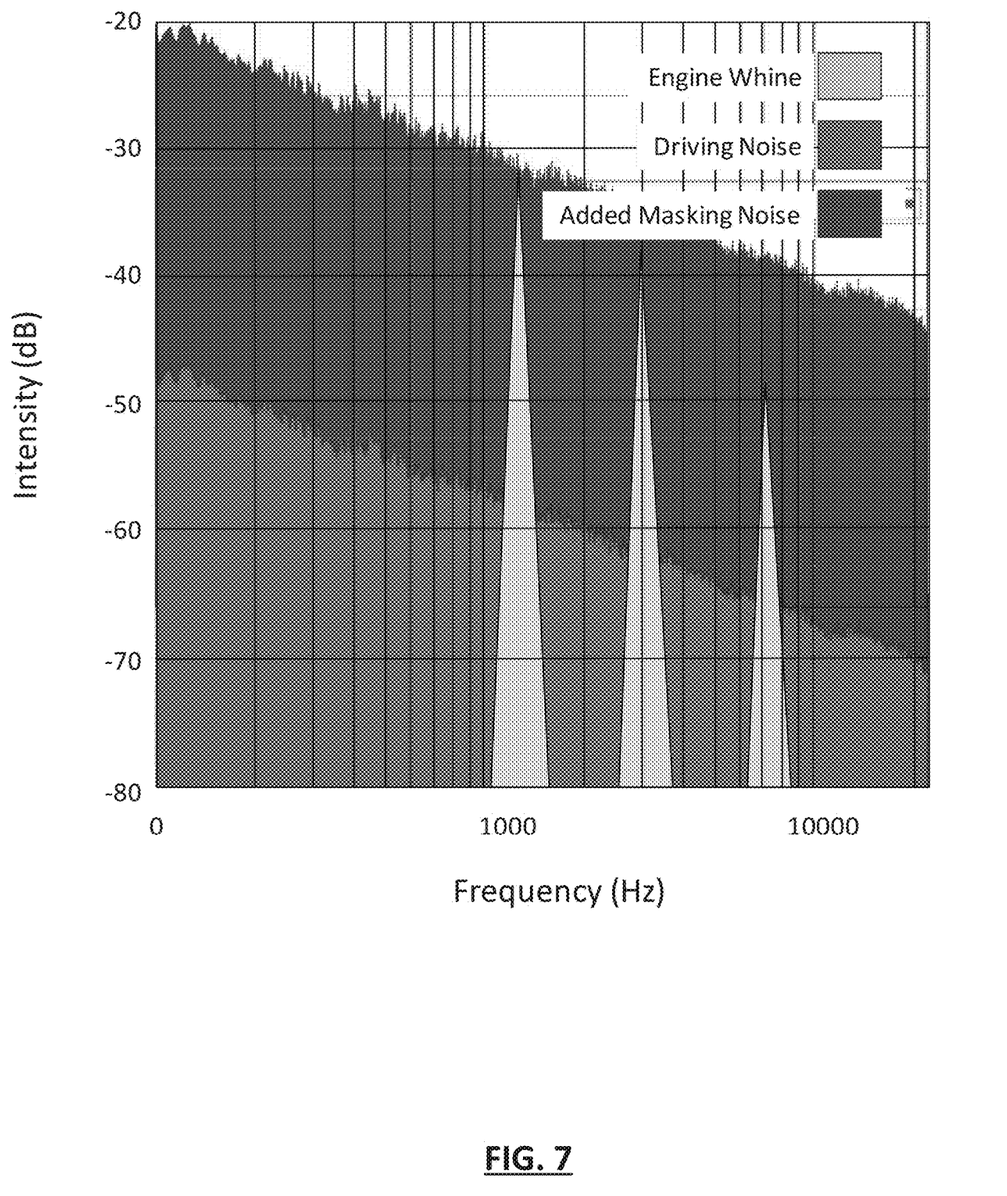
FIG. 7 illustrates, in graph form, an example frequency spectrum of engine whine, driving noise, and added masking noise under relatively higher speed driving conditions.

FIG. 7 illustrates an example frequency spectrum similar to that of FIG. 6, but under relatively higher speed driving conditions. The distinct engine whine tones occur at higher frequencies and have a larger amplitude due to the vehicle's engine/motor being under higher load. Further, the naturally occurring driving noise is louder as compared to the relatively slower driving conditions of FIG. 6. As a result, the added masking noise emulates the louder driving noise at a higher amplitude in order to effectively mask the higher intensity tones.

Example embodiments of the present application are not limited to any particular operating system, system architecture, mobile device architecture, server architecture, or computer programming language.

It will be understood that the applications, modules, routines, processes, threads, or other software components implementing the described method/process may be realized using standard computer programming techniques and languages. The present application is not limited to particular processors, computer languages, computer programming conventions, data structures, or other such implementation details. Those skilled in the art will recognize that the described processes may be implemented as a part of computer-executable code stored in volatile or non-volatile memory, as part of an application-specific integrated chip (ASIC), etc.

Certain adaptations and modifications of the described embodiments can be made. Therefore, the above discussed embodiments are considered to be illustrative and not restrictive.

What is claimed is:

1. A method of masking powertrain noise in a vehicle comprising:
    determining frequency and amplitude characteristics of the powertrain noise;
    determining amplitude characteristics of background noise in the vehicle;
    adaptively filtering one or more of: HVAC sound, occupant conversation sound, vehicle audio system sound, and the determined characteristics of the powertrain noise from the determined characteristics of background noise in the vehicle;
    dynamically generating a masking audio signal based on the determined characteristics of the powertrain noise and background noise; and
    outputting the masking audio signal in a cabin of the vehicle.

2. The method of masking powertrain noise in a vehicle of claim 1, wherein the powertrain noise emanates from one or more of the vehicle engine, electric motor, transmission, drive shafts, differentials, and battery.

3. The method of masking powertrain noise in a vehicle of claim 1, wherein the powertrain noise is tonal in nature and in a frequency range of 500 Hz to 4000 Hz.

4. The method of masking powertrain noise in a vehicle of claim 1, wherein determining the frequency and amplitude characteristics of the powertrain noise includes deriving the characteristics from a model for the vehicle.

5. The method of masking powertrain noise in a vehicle of claim 1, wherein determining the frequency and amplitude characteristics of the powertrain noise includes measuring the characteristics in the cabin of the vehicle.

6. The method of masking powertrain noise in a vehicle of claim 1, wherein determining the frequency and amplitude characteristics of the powertrain noise includes adjusting the characteristics based on one or more of: engine RPM, motor RPM, engine load, motor load, vehicle speed, and vehicle acceleration.

7. The method of masking powertrain noise in a vehicle of claim 1, wherein the background noise in the vehicle includes sound resulting from at least one of wind, road, or tires.

8. The method of masking powertrain noise in a vehicle of claim 1, wherein determining the amplitude characteristics of background noise in the vehicle includes deriving the characteristics from a model for the vehicle.

9. The method of masking powertrain noise in a vehicle of claim 1, wherein determining the amplitude characteristics of background noise in the vehicle includes measuring the characteristics in the cabin of the vehicle.

10. The method of masking powertrain noise in a vehicle of claim 1, wherein outputting the masking audio signal includes playing the masking audio signal through one or more loudspeakers of a vehicle audio system.

11. The method of masking powertrain noise in a vehicle of claim 1, wherein the generated masking audio signal emulates vehicle background noise at a higher vehicle speed than a current vehicle speed.

12. An adaptive noise masking system for masking powertrain noise in a vehicle comprising:
    a noise estimator to determine frequency and amplitude characteristics of the powertrain noise and to determine amplitude characteristics of background noise in the vehicle;
    an adaptive notch filter for filtering one or more of: HVAC sound, occupant conversation sound, vehicle audio system sound, and the determined characteristics of the powertrain noise from the determined characteristics of background noise in the vehicle;
    a masking noise generator to dynamically generate a masking audio signal based on the determined characteristics of the powertrain noise and background noise; and
    one or more vehicle cabin loudspeakers to receive and output the masking audio signal in a cabin of the vehicle.

13. The adaptive noise masking system of claim 12, wherein the noise estimator further includes one or more cabin microphones for measuring at least one of the powertrain noise and the background noise in the cabin of the vehicle.

14. The adaptive noise masking system of claim 12, wherein the noise estimator further includes a memory storing at least one of a cabin noise estimator and a whine noise model, wherein the cabin noise estimator provides a model of background noise characteristics, and wherein the whine noise model provides a model of powertrain noise characteristics.

15. The adaptive noise masking system of claim 12, wherein the noise estimator determines the frequency and amplitude characteristics of the powertrain noise by adjusting the characteristics based on one or more of: engine RPM, motor RPM, engine load, motor load, vehicle speed, and vehicle acceleration.

16. The adaptive noise masking system of claim 12, further comprising an amplifier for boosting the masking audio signal gain between the masking noise generator and the one or more vehicle cabin loudspeakers.

17. The adaptive noise masking system of claim 12, wherein the generated masking audio signal emulates vehicle background noise at a higher vehicle speed than a current vehicle speed.

18. A non-transitory computer-readable storage medium storing processor-executable instructions to mask powertrain noise in a vehicle, wherein the processor-executable instructions, when executed by a processor, cause the processor to:
    determine frequency and amplitude characteristics of the powertrain noise;
    determine amplitude characteristics of background noise in the vehicle;
    adaptively filter one or more of: HVAC sound, occupant conversation sound, vehicle audio system sound, and the determined characteristics of the powertrain noise from the determined characteristics of background noise in the vehicle;

dynamically generate a masking audio signal based on the determined characteristics of the powertrain noise and background noise; and output the masking audio signal in a cabin of the vehicle.

19. A method of masking powertrain noise in a vehicle comprising:

determining frequency and amplitude characteristics of the powertrain noise;

determining amplitude characteristics of background noise in the vehicle;

dynamically generating a masking audio signal based on the determined characteristics of the powertrain noise and background noise; and outputting the masking audio signal in a cabin of the vehicle, wherein the generated masking audio signal emulates vehicle background noise at a higher vehicle speed than a current vehicle speed.

20. The method of masking powertrain noise in a vehicle of claim 19, wherein determining the frequency and amplitude characteristics of the powertrain noise includes deriving the characteristics from a model for the vehicle.

21. The method of masking powertrain noise in a vehicle of claim 19, wherein determining the frequency and amplitude characteristics of the powertrain noise includes measuring the characteristics in the cabin of the vehicle.

22. The method of masking powertrain noise in a vehicle of claim 19, wherein determining the frequency and amplitude characteristics of the powertrain noise includes adjusting the characteristics based on one or more of: engine RPM, motor RPM, engine load, motor load, vehicle speed, and vehicle acceleration.

23. The method of masking powertrain noise in a vehicle of claim 19, wherein determining the amplitude characteristics of background noise in the vehicle includes measuring the characteristics in the cabin of the vehicle.

24. The method of masking powertrain noise in a vehicle of claim 19, further comprising adaptively filtering one or more of: HVAC sound, occupant conversation sound, vehicle audio system sound, and the determined characteristics of the powertrain noise from the determined characteristics of background noise in the vehicle.

25. An adaptive noise masking system for masking powertrain noise in a vehicle comprising:

a noise estimator to determine frequency and amplitude characteristics of the powertrain noise and to determine amplitude characteristics of background noise in the vehicle;

a masking noise generator to dynamically generate a masking audio signal based on the determined characteristics of the powertrain noise and background noise; and one or more vehicle cabin loudspeakers to receive and output the masking audio signal in a cabin of the vehicle, wherein the generated masking audio signal emulates vehicle background noise at a higher vehicle speed than a current vehicle speed.

26. The adaptive noise masking system of claim 25, wherein the noise estimator further includes one or more cabin microphones for measuring at least one of the powertrain noise and the background noise in the cabin of the vehicle.

27. The adaptive noise masking system of claim 25, further comprising an adaptive notch filter for filtering one or more of: HVAC sound, occupant conversation sound, vehicle audio system sound, and the determined characteristics of the powertrain noise from the determined characteristics of background noise in the vehicle.

28. The adaptive noise masking system of claim 25, wherein the noise estimator further includes a memory storing at least one of a cabin noise estimator and a whine noise model, wherein the cabin noise estimator provides a model of background noise characteristics, and wherein the whine noise model provides a model of powertrain noise characteristics.

29. The adaptive noise masking system of claim 25, wherein the noise estimator determines the frequency and amplitude characteristics of the powertrain noise by adjusting the characteristics based on one or more of: engine RPM, motor RPM, engine load, motor load, vehicle speed, and vehicle acceleration.

30. A non-transitory computer-readable storage medium storing processor-executable instructions to mask powertrain noise in a vehicle, wherein the processor-executable instructions, when executed by a processor, cause the processor to:

determine frequency and amplitude characteristics of the powertrain noise;

determine amplitude characteristics of background noise in the vehicle;

dynamically generate a masking audio signal based on the determined characteristics of the powertrain noise and background noise; and output the masking audio signal in a cabin of the vehicle, wherein the generated masking audio signal emulates vehicle background noise at a higher vehicle speed than a current vehicle speed.

* * * * *